(12) United States Patent
Wakabayashi (10) Patent No.: US 8,592,957 B2
(45) Date of Patent: Nov. 26, 2013

(54) SEMICONDUCTOR DEVICE HAVING SHIELD LAYER AND CHIP-SIDE POWER SUPPLY TERMINAL CAPACITIVELY COUPLED THEREIN

(75) Inventor: Yoshiaki Wakabayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/390,184

(22) PCT Filed: Jun. 9, 2010

(86) PCT No.: PCT/JP2010/003835
§ 371 (c)(1),
(2), (4) Date: Feb. 13, 2012

(87) PCT Pub. No.: WO2011/021328
PCT Pub. Date: Feb. 24, 2011

(65) Prior Publication Data
US 2012/0139091 A1 Jun. 7, 2012

(30) Foreign Application Priority Data

Aug. 18, 2009 (JP) ................. P2009-189130

(51) Int. Cl.
*H01L 23/552* (2006.01)
*H01L 23/34* (2006.01)
*H01L 23/48* (2006.01)

(52) U.S. Cl.
USPC ............ 257/659; 257/728; 257/734; 257/778

(58) Field of Classification Search
None
See application file for complete search history.

(56) References Cited

U.S. PATENT DOCUMENTS

| 5,510,758 A * | 4/1996 | Fujita et al. ................. 333/247 |
| 6,297,551 B1 | 10/2001 | Dudderar et al. |
| 2003/0218257 A1 | 11/2003 | Ishio et al. |
| 2005/0104165 A1 * | 5/2005 | Ishio et al. ................. 257/659 |

FOREIGN PATENT DOCUMENTS

| JP | 3066855 U | 3/2000 |
| JP | 2001-267487 A | 9/2001 |
| JP | 2003-347441 A | 12/2003 |
| JP | 3590340 B2 | 11/2004 |
| JP | 2006-216672 A | 8/2006 |

OTHER PUBLICATIONS

International Search Report in PCT/JP2010/003835 dated Jul. 20, 2010 (English Translation Thereof).

* cited by examiner

*Primary Examiner* — Julio J Maldonado
*Assistant Examiner* — Harpreet Singh
(74) *Attorney, Agent, or Firm* — McGinn Intellectual Property Law Group, PLLC (57) ABSTRACT

Provided is a semiconductor device including a wiring board having a first surface on which a board-side ground terminal and a board-side power supply terminal are provided; a semiconductor chip arranged so as to face the first surface of the wiring board, where the first surface faces an opposite surface of the semiconductor chip; a shield layer provided at the semiconductor chip so as to cover an outer surface of the semiconductor chip except for the opposite surface; a chip-side power supply terminal which is provided on the opposite surface and is electrically connected to the board-side power supply terminal; a chip-side ground terminal which is provided on the opposite surface and is electrically connected to the board-side ground terminal and the shield layer; and a first capacitively coupled part by which the shield layer and the chip-side power supply terminal are capacitively coupled with each other.

9 Claims, 9 Drawing Sheets

SEMICONDUCTOR DEVICE HAVING SHIELD LAYER AND CHIP-SIDE POWER SUPPLY TERMINAL CAPACITIVELY COUPLED THEREIN

TECHNICAL FIELD

The present invention relates to a semiconductor device, in particular, those having a shielding structure which blocks electromagnetic waves.

Priority is claimed on Japanese Patent Application No. 2009-189130, filed Aug. 18, 2009, the contents of which are incorporated herein by reference.

BACKGROUND ART

In accordance with recent technological progress, development of semiconductor devices such as one-chip MMICs (Monolithic Microwave Integrated Circuits) operating in a milliwave band (e.g., 60 GHz or 76 GHz) have been advanced.

In such a milliwave band, since minute inductance or capacitance affects matching characteristics of the semiconductor device, wiring for connecting an MMIC and its package should be as small as possible. Therefore, not gold wire connection but flip-chip connection using gold bumps having an inductance smaller than that of wires has been proposed (see, for example, a semiconductor device disclosed in FIG. 1 of Patent Document 1).

In MMICs which operate in a high-frequency band (that includes the milliwave band), the surroundings of the MMIC are often subjected to electric shielding so as to block unnecessary electromagnetic waves emitted from the MMIC. Many shielding structures using the above-described flip-chip connection have been proposed.

For example, in a conventional technique for implementing a shielding structure disclosed in Patent Document 2, back and side surfaces of an MCM (Multichip Module) substrate which employs the flip-chip connection are metalized, and the metalized side surfaces are connected via solder to a packaging substrate on which a solder wall is formed.

Additionally, in a conventional technique for implementing a shielding structure disclosed in Patent Document 3, bumps connected to a ground electrode are arranged so as to surround a functional circuit, and a cover substrate is connected to the bumps.

In addition, a semiconductor device disclosed in Patent Document 4 has a semiconductor chip, a pair of ground pads provided on the semiconductor chip, and a pair of signal line pads provided between the ground pads on the semiconductor chip.

A first metal layer is provided on a side wall of the semiconductor chip. A second metal layer is connected to the first metal layer, and reaches the ground pads. To each of the signal line pads, one end of a bonding wire is connected. The other end of each bonding wire is connected to a signal line.

Furthermore, a third metal layer is provided on the lower surface of the semiconductor chip.

PRIOR ART DOCUMENT

Patent Document

Patent Document 1: Japanese Unexamined Patent Application, First Publication No. 2001-267487 (see FIG. 1).
Patent Document 2: Japanese Patent registration No. 3590340 (see FIG. 2).
Patent Document 3: Japanese Utility Model registration No. 3066855 (see FIG. 1).
Patent Document 4: Japanese Unexamined Patent Application, First Publication No. 2006-216672 (see FIG. 10).

DISCLOSURE OF INVENTION

Problem to be Solved by the Invention

The shielding structure for MCM substrates disclosed in Patent Document 2 has a section structure akin to a structure for flip-chip connection of a semiconductor device, and thus may be applied to the flip-chip connection of a semiconductor device. In the flip-chip connection of a semiconductor device, not only bumps using solder but also bump connection using gold or copper is generally used.

However, the bump connection using gold or copper requires a process of forming a solder wall in addition to the bump connection process, which increases the manufacturing cost.

Additionally, the shielding structure disclosed in Patent Document 3 requires addition arrangement of grounded bumps along an outer periphery of a functional circuit. Furthermore, if the target for shielding includes an active element, a power supply terminal or power wiring should be provided in the vicinity of the active element. Therefore, it is very difficult to arrange bumps around the shielding target, and such arrangement is not realistic.

In the semiconductor device disclosed in Patent Document 4, although electromagnetic waves emitted downward from the semiconductor chip can be blocked using the third metal layer, a part through which a bonding wire passes or a part having no second metal layer above the semiconductor chip cannot sufficiently block electromagnetic waves.

In addition, although electromagnetic waves can be blocked by narrowing a gap between the bonding wire and the second metal layer, the dimension accuracy of the gap is uneven and thus this method is not effective.

In light of the above circumstances, an object of the present invention is to provide a semiconductor device having a shielding structure that can reliably block electromagnetic waves without requiring an additional process for flip-chip connection.

Means for Solving the Problem

In order to achieve the above object, the present invention provides a semiconductor device comprising:

a wiring board having a first surface on which a board-side ground terminal and a board-side power supply terminal are provided;

a semiconductor chip arranged so as to face the first surface of the wiring board, where the first surface faces an opposite surface of the semiconductor chip;

a shield layer provided at the semiconductor chip so as to cover an outer surface of the semiconductor chip except for the opposite surface;

a chip-side power supply terminal which is provided on the opposite surface and is electrically connected to the board-side power supply terminal;

a chip-side ground terminal which is provided on the opposite surface and is electrically connected to the board-side ground terminal and the shield layer; and a first capacitively coupled part by which the shield layer and the chip-side power supply terminal are capacitively coupled with each other.

Effect of the Invention

In accordance with the semiconductor device of the present invention, the board-side power supply terminal and the chip-side power supply terminal are electrically connected to each other, and the shield layer, the chip-side ground terminal, and the board-side ground terminal are electrically connected to each other.

Even when the shield layer and the chip-side power supply terminal are separated from each other via a specific distance, if both members are capacitively coupled, they produce a substantial short circuit state. Therefore, electromagnetic waves can be effectively blocked also between the shield layer and the chip-side power supply terminal.

Although an operating semiconductor chip generally emits electromagnetic waves, the above structure for the flip-chip connection between the wiring board and the semiconductor chip can reliably block the milled electromagnetic waves without providing an additional process.

MODE FOR CARRYING OUT THE INVENTION

First Embodiment

Below, a first embodiment of the present invention will be explained with reference to FIGS. 1 to 5.

Figure 1:
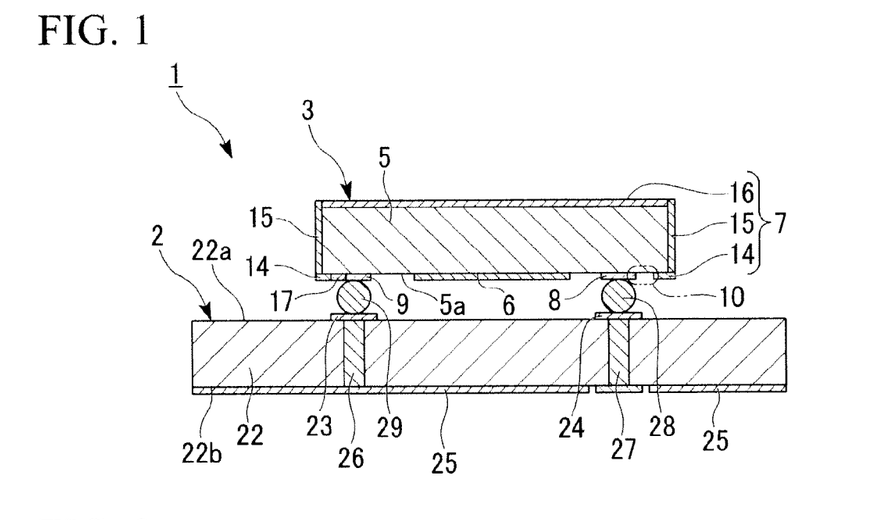
FIG. 1 is a side sectional view of a semiconductor device as a first embodiment of the present invention.

As shown in FIG. 1, a semiconductor device 1 of the present embodiment may be an MMIC which operates in a milliwave band (for electromagnetic waves having a wavelength of 1 mm to 10 mm), and a semiconductor chip 3 having a flat-plate shape is connected by means of flip-chip connection to a top surface (i.e., first surface) 22a of a base part 22 (explained later) of a multilayer substrate (i.e., wiring board) 2.

Figure 2:
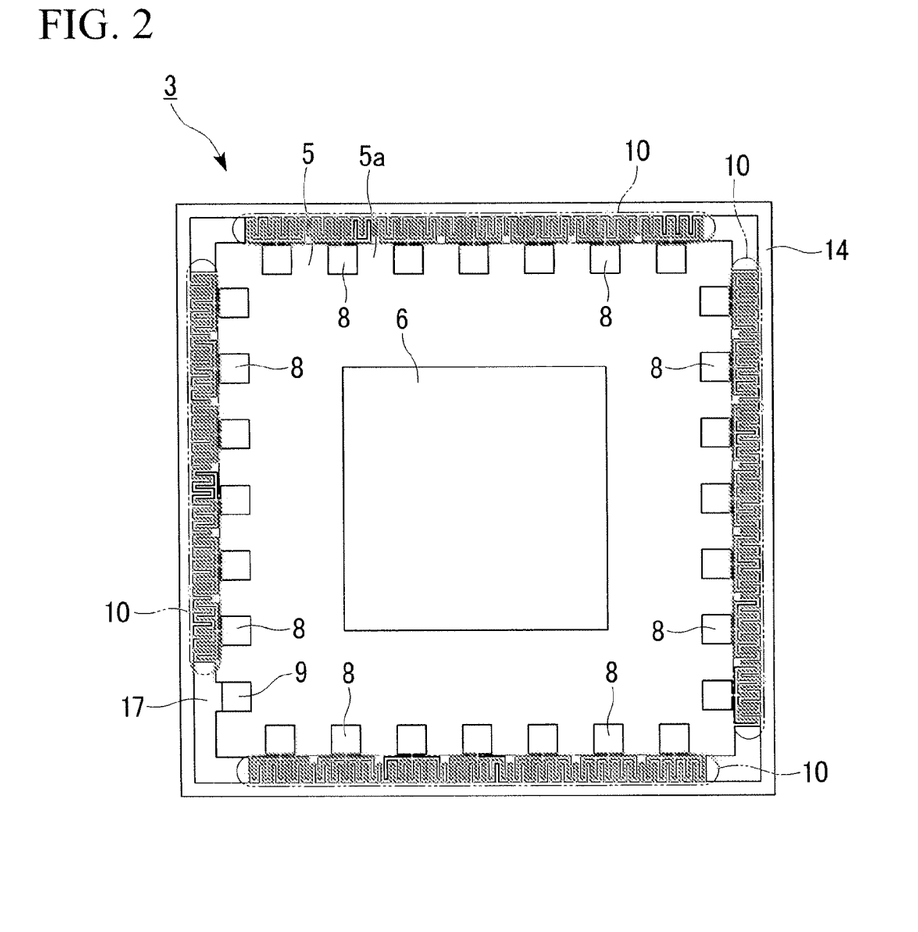
FIG. 2 is a bottom view of a semiconductor chip in the semiconductor device.

As shown in FIGS. 1 and 2, the semiconductor chip 3 has a base part 5 having a flat-plate shape; an electronic circuit 6 provided in a central area of a bottom surface (i.e., opposite surface) 5a of the base part 5; a shield layer 7 provided so as to cover the outer surface of the base part 5 except for the bottom surface 5a; DC terminals (i.e., chip-side power supply terminals) 8 provided so as to surround the electronic circuit 6 on the bottom surface 5a; a ground terminal (i.e., chip-side ground terminal) 9 provided on the bottom surface 5a; and first capacitively coupled parts 10 that capacitively couples the shield layer 7 with the DC terminals 8.

The base part 5 of the semiconductor chip 3 is made of a material such as gallium arsenide, silicon, or silicon germanium. Although gallium arsenide is most suitable for the base part 5 in the current technique, research and development of milliwave semiconductors using a material (e.g., silicon or silicon germanium) other than gallium arsenide have been advanced. Therefore, the material for the base part 5 may be any of the above-described materials which can implement a milliwave semiconductor, and is not limited to gallium arsenide.

The electronic circuit 6 is a functional component such as a sensor or an amplifier, and emits electromagnetic waves in a milliwave bane in accordance with the operation thereof.

The shield layer 7 has an outer-peripheral ground 14 provided an outer edge of the bottom surface 5a, a side metal part 15 provided on side faces of the base part 5, and a back metal part 16 provided on the top surface of the base part 5, where the ground 14 and the metal parts 15 and 16 are integrated into one layer.

Most preferably, the shield layer 7 is formed by sputtering using gold plating or gold, which is often employed in manufacturing of milliwave semiconductors. Although it is preferable that the entire surface of the shield layer 7 is made of metal, a hole or slit may be partially formed in the shield layer 7.

Generally, for an operation frequency of 30 GHz of the electronic circuit 6, the skin depth of gold is approximately 0.45 μm. In consideration thereof, it is most preferable that the thickness of gold is 1 μm or greater. However, the effects of the present invention are of course secured when the thickness is less than 1 μm.

In addition, there is no problem when metal other than gold is used for forming the shield layer 7. There is also no problem when the shield layer 7 is made of gold alloy (i.e., not gold only), or a combination of a gold layer and a layer of other metal, disposed above or under the gold layer.

Each DC terminal 8 and the ground terminal 9 each have a substantially square shape in plan view, and the DC terminals 8 and the ground terminal 9 are separately disposed to form a square arrangement.

The DC terminals 8 are positioned away from the outer-peripheral ground 14 toward a central area of the bottom surface 5a. The ground terminal 9 is close to but separated from one corner of the outer-peripheral ground 14 toward a central area of the bottom surface 5a. The ground terminal 9 and the outer-peripheral ground 14 are directly and electrically connected via a wiring pattern 17 (i.e., conductor).

Although no RF terminals as high-frequency input and output terminals are shown in the drawings, it is of course that RF terminals may be provided in the vicinity of each DC terminal 8 or the ground terminal 9.

As described above, in the present embodiment, each DC terminal 8 and the ground terminal 9 each have a substantially square shape in plan view. However, each DC terminal 8 and the ground terminal 9 each may have a circular or rectangular shape in plan view, that is, the shape is not specifically limited.

As also described above, in the present embodiment, the DC terminals 8 and the ground terminal 9 are separately disposed to form a square arrangement, thereby surrounding the electronic circuit 6. However, the arrangement of the DC terminals and the ground terminal is not limited thereto, and any arrangement for surrounding the electronic circuit 6 by the relevant terminals may be employed.

Figure 3:
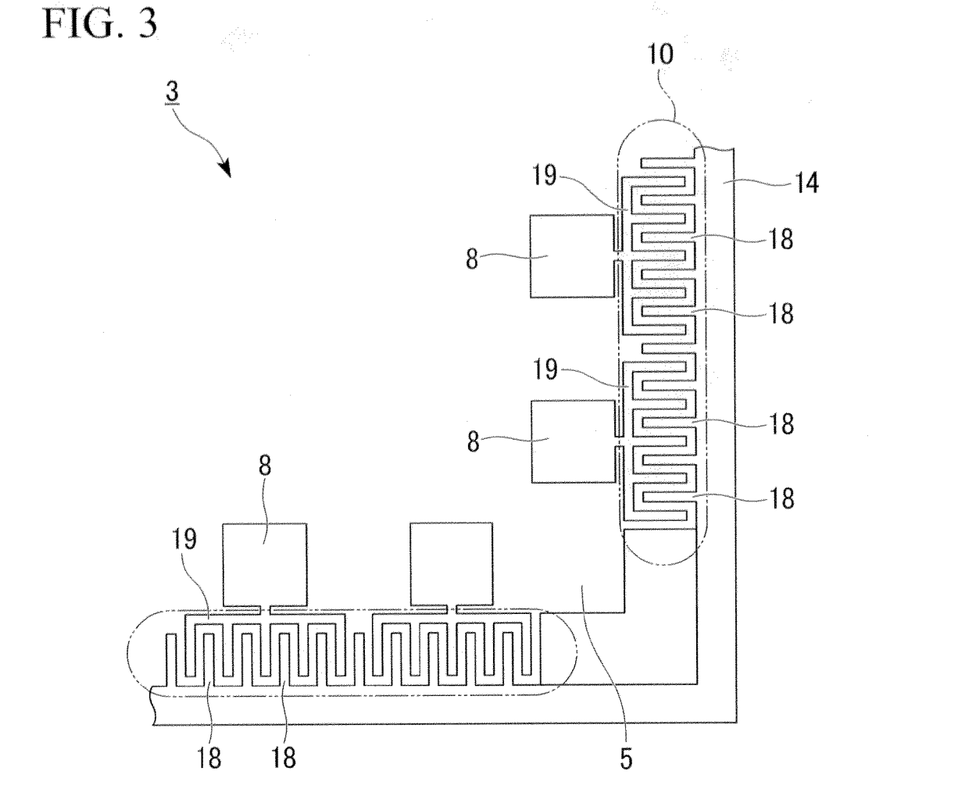
FIG. 3 is an enlarged view of a distinct part in FIG. 2.

As shown in FIG. 3, each first capacitively coupled part 10 has inter-digital electrodes 18 and 19 which are respectively provided at the outer-peripheral ground 14 and each DC terminal 8. The inter-digital electrodes 18 and 19 each have a comb shape, and are separated from but engaged with each other to secure a small gap therebetween.

In the present embodiment, the inter-digital electrodes 18 and 19 extend perpendicular to aside face (adjacent to the electrodes) of the base part 5 in plan view.

In a milliwave band, in order to consider that the inter-digital electrodes 18 and 19 form a short circuit, it is preferable that the first capacitively coupled part 10 has a relatively large capacity, and thus the gap between the inter-digital electrodes 18 and 19 is very small. Accordingly, it is most preferable to produce the inter-digital electrodes 18 and 19 based on a minimization rule for the manufacturing procedure of the semiconductor device 1.

Similar to the outer-peripheral ground 14, it is most preferable to make the DC terminals 8, the ground terminal 9, and the inter-digital electrodes 18 and 19 by means of sputtering using gold plating or gold. Here, the thicker the inter-digital electrodes 18 and 19, the larger the capacity of the first capacitively coupled part 10. However, in consideration of the relevant cost, convenience in the connection, or easiness for integral forming together with the outer-peripheral ground 14, it is most preferable that the inter-digital electrodes 18 and 19 have a thickness of 1 μm or greater, similar to the outer-peripheral ground 14.

Also similar to the outer-peripheral ground 14, the effects of the present invention are secured if the inter-digital electrodes 18 and 19 are made of a material other than gold, or have a thickness less than 1 μm.

As shown in FIG. 1, the multilayer substrate 2 has a base part 22 having a flat-plate shape; a ground terminal (i.e., board-side ground terminal) 23 and DC terminals (i.e., board-side power supply terminals) 24 (only one is shown in FIG. 1) provided on a top surface 22a of the base part 22; a ground layer 25 formed on a bottom surface 22b of the base part 22; a ground pier that connects the ground terminal 23 with the ground layer 25; and a DC pier 27 which is connected to each DC terminal 24 and extends to the bottom surface 22b of the base part 22.

The base part 22 has multiple stacked layers, and an outer surface thereof has insulation characteristics. A ceramic substrate is generally used as abase part of a multilayer substrate on which a semiconductor chip used in a milliwave band is mounted. Also in the present invention, a ceramic substrate is most suitable for the base part 22. However, the effects of the present invention are secured if another material such as a glass-epoxy substrate is used.

In a plan view in which the bottom surface 5a of the semiconductor chip 3 is superimposed on the top surface 22a of the base part 22, the ground terminal 23 and the DC terminals 24 are arranged to respectively overlap the ground terminal 9 and the DC terminals 8. That is, the ground terminal 9 and the DC terminals 8 are separated from each other to form a square arrangement on the top surface 22a of the base part 22.

The ground layer 25 is made of metal and should have an area having a shape corresponding to the square arrangement (see FIG. 2) formed by the ground terminal 9 and the DC terminals 8 or an area larger than such a shape.

Additionally, although the ground layer 25 is provided on the bottom surface 22b of the base part 22 in FIG. 1, there is no problem if the ground layer 25 is formed at an internal layer of the base part 22.

The DC pier 27 is not directly connected to the ground layer 25, and disposed closely to the ground layer 25 to secure a gap of approximately a few tens micrometers therebetween. Since a gap sufficiently small for the wavelength of electromagnetic waves to be blocks does not affect the effect of electromagnetic wave blocking, there is no problem when the gap is provided between the DC pier 27 and the ground layer 25.

Such a gap is called a "clearance", and is generally defined as a design rule depending on an accuracy for the manufacturing procedure of the semiconductor device 1, and thus the size of the gap may be determined in accordance with the design rule.

Although it is most preferable that the ground terminal 23, the DC terminals 24, the ground layer 25, the ground pier 26, and the DC pier 27 are formed by applying gold plating to silver or copper, there is no problem if they are made of another metal material.

There is also no problem if a conductor layer or pier other than those shown in FIG. 1 is present on the multilayer substrate 2.

In a state in which the bottom surface 5a of the semiconductor chip 3 faces the top surface 22a of the multilayer substrate 2, the DC terminals 8 are electrically connected to the DC terminals 24 via bumps 28, and the ground terminal 9 is electrically connected to the ground terminal 23 via a bump 29.

In order to implement the effects of the present invention, the kind of each bump is not specifically limited. However, stud bumps using gold identical to the DC terminals 8 and 24 and the ground terminals 9 and 23 using gold are most preferable.

As described above, in the semiconductor device 1 of the present embodiment, the DC pier 27, the DC terminals 24, the bumps 28, and the DC terminals 8 are conductors which are electrically connected with each other, and the shield layer 7, the wiring pattern 17, the ground terminal 9, the bump 29, the ground terminal 23, the ground pier 26, and the ground layer 25 are also conductors which are electrically connected with each other.

In addition, since the inter-digital electrodes 18 and 19, which are respectively provided at the outer-peripheral ground 14 and each DC terminal 8, are capacitively coupled with each other, they have the same electric potential. In addition, the DC pier 27 and the ground layer 25 of the multilayer substrate 2 are arranged close to each other, where a gap of approximately a few tens micrometers is secured therebetween.

A gap of approximately a few tens micrometers for a wavelength in a milliwave band (1 mm to 10 mm) is sufficiently small such as one tenth or smaller of the wavelength, and thus does not damage the shielding effect for blocking the relevant electromagnetic waves.

Therefore, electromagnetic waves emitted from the electronic circuit 6 can be reliably blocked using the DC pier 27, the DC terminals 24, the bumps 28, the DC terminals 8, the first capacitively coupled parts 10, the shield layer 7, the wiring pattern 17, the ground terminal 9, the bump 29, the ground terminal 23, the ground pier 26, and the ground layer 25.

In addition, each structural element of the semiconductor device 1 in the present embodiment is used in an ordinary milliwave MMIC. Therefore, the electromagnetic wave blocking can be performed only by appropriately adjusting or modifying existing processes, that is, no additional process or additional material is required.

Additionally, since the semiconductor chip 3 is connected to the multilayer substrate 2 by means of flip-chip connection, the semiconductor chip 3 can be connected to the multilayer substrate 2 is a compact form.

Furthermore, the DC terminals 8 are provided around the electronic circuit 6, and are each capacitively coupled with the outer-peripheral ground 14 via the first corresponding capacitively coupled part 10. Therefore, it is possible to further reliably block the electromagnetic waves which pass between the outer-peripheral ground 14 and the DC terminals 8.

Additionally, since the ground terminal 9 is directly and electrically connected to the outer-peripheral ground 14 via the wiring pattern 17, it is possible to prevent the electromagnetic waves from passing between the ground terminal 9 and the outer-peripheral ground 14.

Next, results of analysis of electromagnetic wave blocking effects by the semiconductor device 1 of the present embodiment will be shown.

Figure 4:
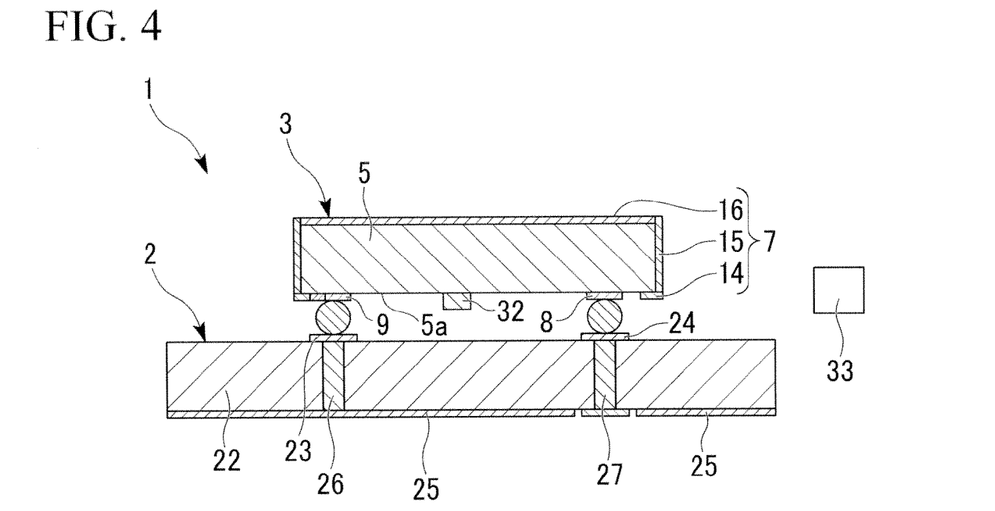
FIG. 4 is a diagram showing an analysis model for analyzing electromagnetic wave blocking effects by the semiconductor device.

As shown in FIG. 4, it was assumed that an electromagnetic wave emitting source 32 is present on the bottom surface 5a of the semiconductor device 1, and characteristics of signal transmission between the surface of the semiconductor device 1 and an electromagnetic wave receiving antenna 33 separated from the semiconductor device 1 were obtained by means of three-dimensional electromagnetic field analysis.

Figure 5:
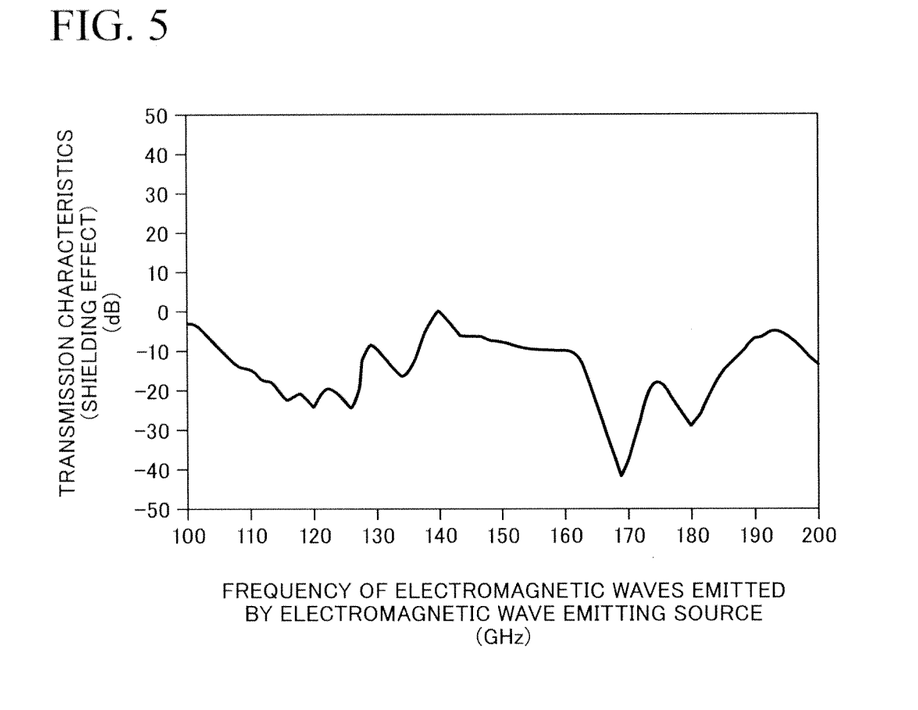
FIG. 5 is a graph showing analyzed results using the analysis model.

Results of the three-dimensional electromagnetic field analysis are shown in FIG. 5. In the figure, the horizontal axis indicates the frequency (GHz) of electromagnetic waves emitted from the electromagnetic wave emitting source 32, and the vertical axis indicates difference (dB) between the transmission gain of the semiconductor device 1 in the present embodiment and the transmission gain of a semiconductor device (as a comparative example) which has no first capacitively coupled part 10.

In the graph, when the transmission gain difference (of the vertical axis) has a negative value, the smaller the value, the larger the effect of the first capacitively coupled parts 10 of the semiconductor device 1.

According to the analysis results of FIG. 5, the semiconductor device 1 of the present embodiment provides distinctive effects in a milliwave band of frequencies higher than 100 GHz.

When regarding the capacitive coupling of the first capacitively coupled part 10 as a simple parallel-plate capacitor, if the distance between the electrodes is halved, the electric capacitance of the capacitor is doubled. Therefore, it is obvious that the effects of the present embodiment can be obtained from a further lower frequency, for example, by forming the inter-digital electrodes by means of a process having further finer manufacturing rules.

The formation of the inter-digital electrodes 18 and 19 is not limited to that shown in the present embodiment, and any formation for implementing highly capacitive coupling between the outer-peripheral ground 14 and the DC terminals 8 may be employed.

Second Embodiment

Below, a second embodiment of the present invention will be explained, where parts identical to those in the previous embodiment are given identical reference numerals, and explanations thereof are omitted, that is, only distinctive features will he explained.

Figure 6:
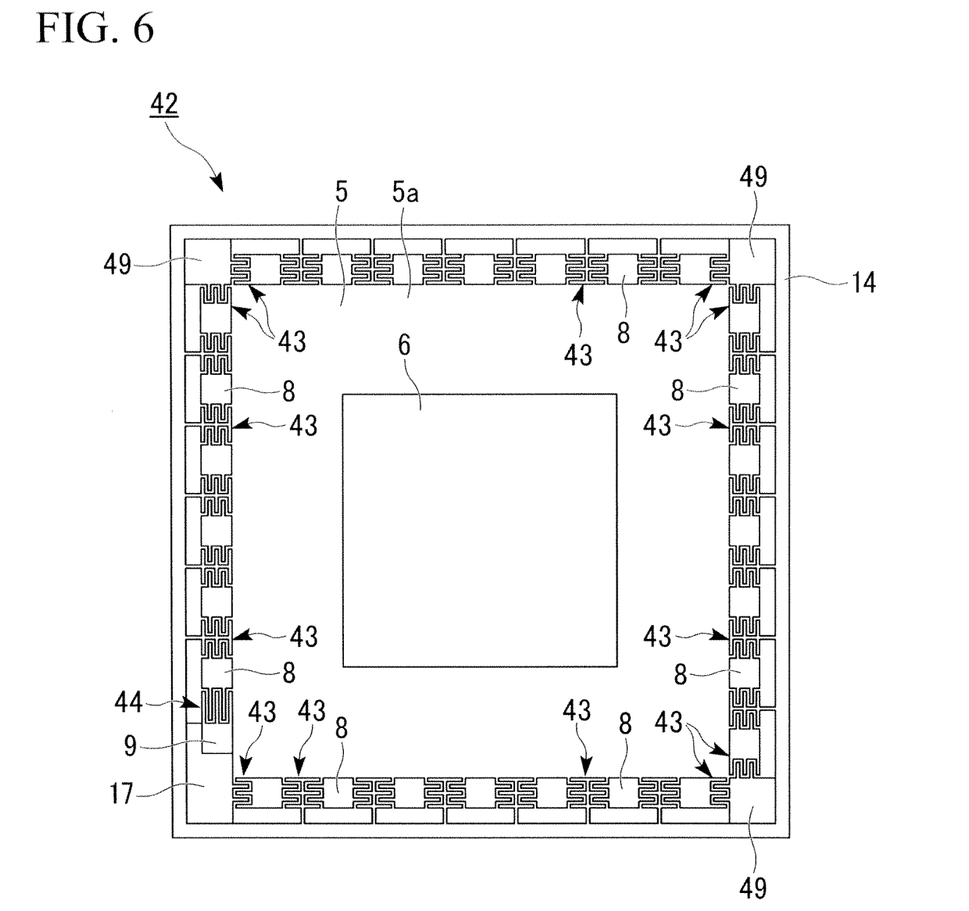
FIG. 6 is a bottom view of a semiconductor chip in a semiconductor device as a second embodiment of the present invention.

As shown in FIG. 6. a semiconductor chip 42 of the semiconductor device in the present embodiment has first capacitively coupled parts 43 (instead of the first capacitively coupled parts 10 of the semiconductor chip 3 in the semiconductor device of the previous embodiment), and a second capacitively coupled part 44 for capacitively coupling one DC terminal 8 and the ground terminal 9.

Figure 7:
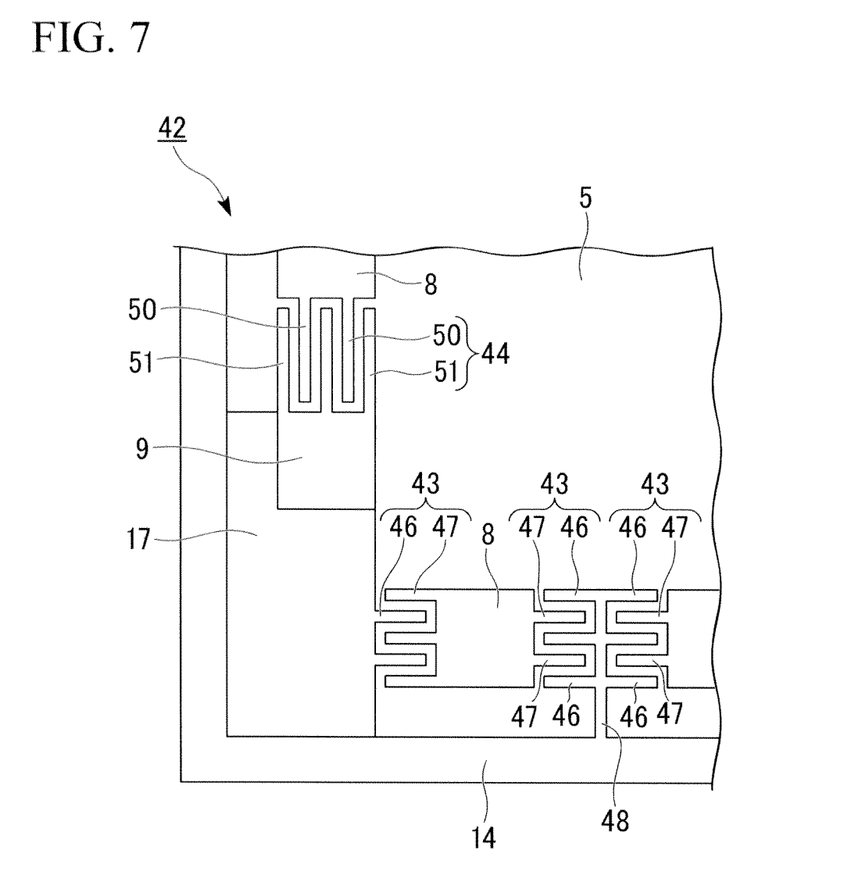
FIG. 7 is an enlarged view of a distinct part in FIG. 6.

As shown in FIG. 7, each first capacitively coupled part 43 has inter-digital electrodes 46 and 47, which are respectively provided at the outer-peripheral ground 14 and each DC terminal 8. The inter-digital electrodes 46 and 47 each have a comb shape, and are separated from but engaged with each other to secure a small gap therebetween.

In plan view, the inter-digital electrode 46 extends in parallel to a side face (adjacent to the electrode) of the base part 5, and is electrically connected to a wiring pattern 48 which extends (from the outer-peripheral ground 14) perpendicular to the adjacent side face of the base part 5. The inter-digital electrode 47 is arranged substantially parallel to the corresponding inter-digital electrode 46 so that inter-digital electrode 47 is interposed between the relevant inter-digital electrodes 46.

As shown in FIG. 6 showing the present embodiment, at three corners of the outer-peripheral ground 14 where no ground terminal 9 is provided, wiring patterns 49 are provided and electrically connected to the outer-peripheral ground 14.

Another reason for providing the above-described first capacitively coupled parts 43 is to make the outer-peripheral ground 14 and the dc terminals 8 be capacitively coupled via the wiring patterns 49.

As shown in FIG. 7, further another reason for providing the above-described first capacitively coupled parts 43 is to make the outer-peripheral ground 14 and the dc terminals 8 be capacitively coupled via the wiring pattern 17.

As shown in FIG. 7, the second capacitively coupled part 44 has inter-digital electrodes 50 and 51, which are respectively provided at one DC terminal 8 and the ground terminal 9. The inter-digital electrodes 50 and 51 each have a comb shape. In the present embodiment, the inter-digital electrodes 50 and 51 extend in parallel to a side face (adjacent to the electrodes) of the base part 5 in plan view.

In accordance with the semiconductor device of the present embodiment, a shielding structure for reliably blocking electromagnetic waves emitted from the electronic circuit 6 can be implemented without providing no additional process.

In addition, the second capacitively coupled part 44 between one DC terminal 8 and the ground terminal 9 performs capacitive coupling using the inter-digital electrodes 50 and 51, thereby further reliably blocking electromagnetic waves emitted from the electronic circuit 6.

Although the first capacitively coupled part 43 is provided at each DC terminal 8, only part of the DC terminals 8 may have the first capacitively coupled part 43.

Third Embodiment

Below, a third embodiment of the present invention will be explained, where parts identical to those in the previous embodiments are given identical reference numerals, and explanations thereof are omitted, that is, only distinctive features will be explained.

Figure 8:
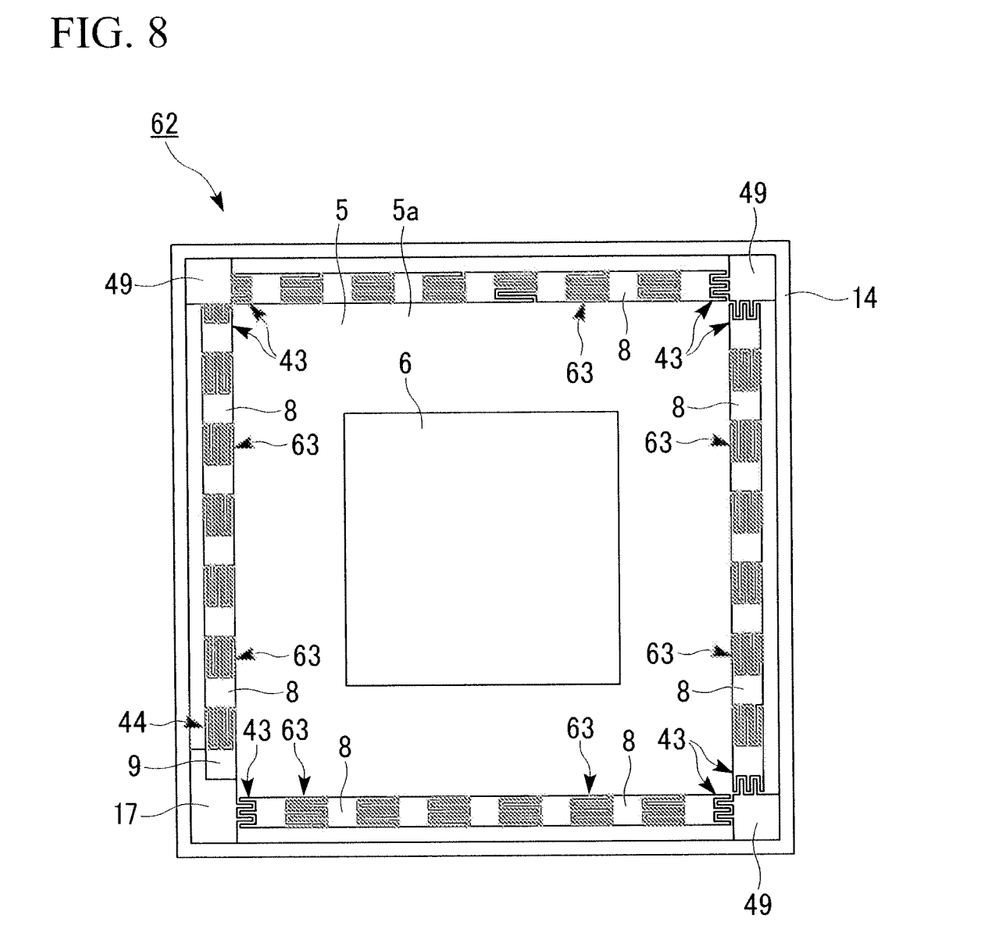
FIG. 8 is a bottom view of a semiconductor chip in a semiconductor device as a third embodiment of the present invention.

As shown in FIG. 8, a semiconductor chip 62 of the semiconductor device in the present embodiment has third capacitively coupled parts 63, each implementing capacitive coupling between adjacent DC terminals 8, instead of the first capacitively coupled parts 43 connected to the wiring pattern 48 of the semiconductor chip 42 in the semiconductor device of the second embodiment.

Figure 9:
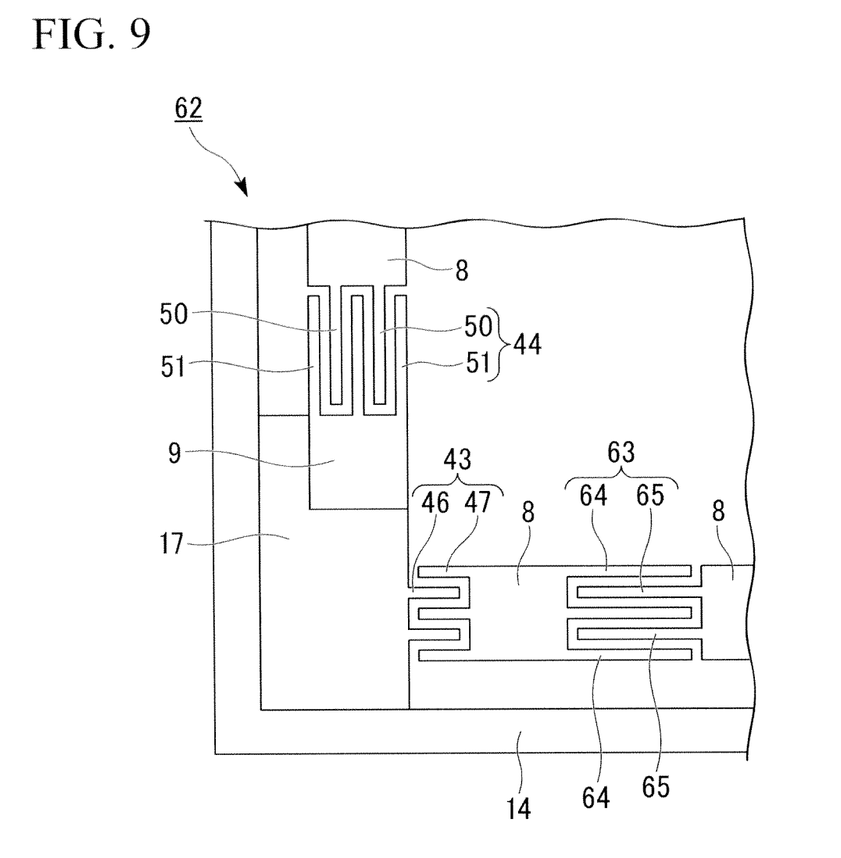
FIG. 9 is an enlarged view of a distinct part in FIG. 8.

As shown in FIG. 9, each third capacitively coupled part 63 has inter-digital electrodes 64 and 65, which are respectively provided at one DC terminal 8 and another DC terminal 8 adjacent thereto. The inter-digital electrodes 64 and 65 each have a comb shape, and are separated from but engaged with each other to secure a small gap therebetween.

In plan view, the inter-digital electrodes 64 and 65 extend in parallel to aside face (adjacent to the electrodes) of the base part 5.

In accordance with the semiconductor device of the present embodiment, a shielding structure for reliably blocking electromagnetic waves emitted from the electronic circuit 6 can be implemented without providing no additional process.

In addition, the third capacitively coupled part 63 between adjacent DC terminals 8 performs capacitive coupling using the inter-digital electrodes 64 and 65, thereby further reliably blocking electromagnetic waves emitted from the electronic circuit 6, and making the adjacent DC terminals 8 have the same electric potential.

Fourth Embodiment

Below, a fourth embodiment of the present invention will be explained, where parts identical to those in the previous embodiments are given identical reference numerals, and explanations thereof are omitted, that is, only distinctive features will be explained.

Figure 10:
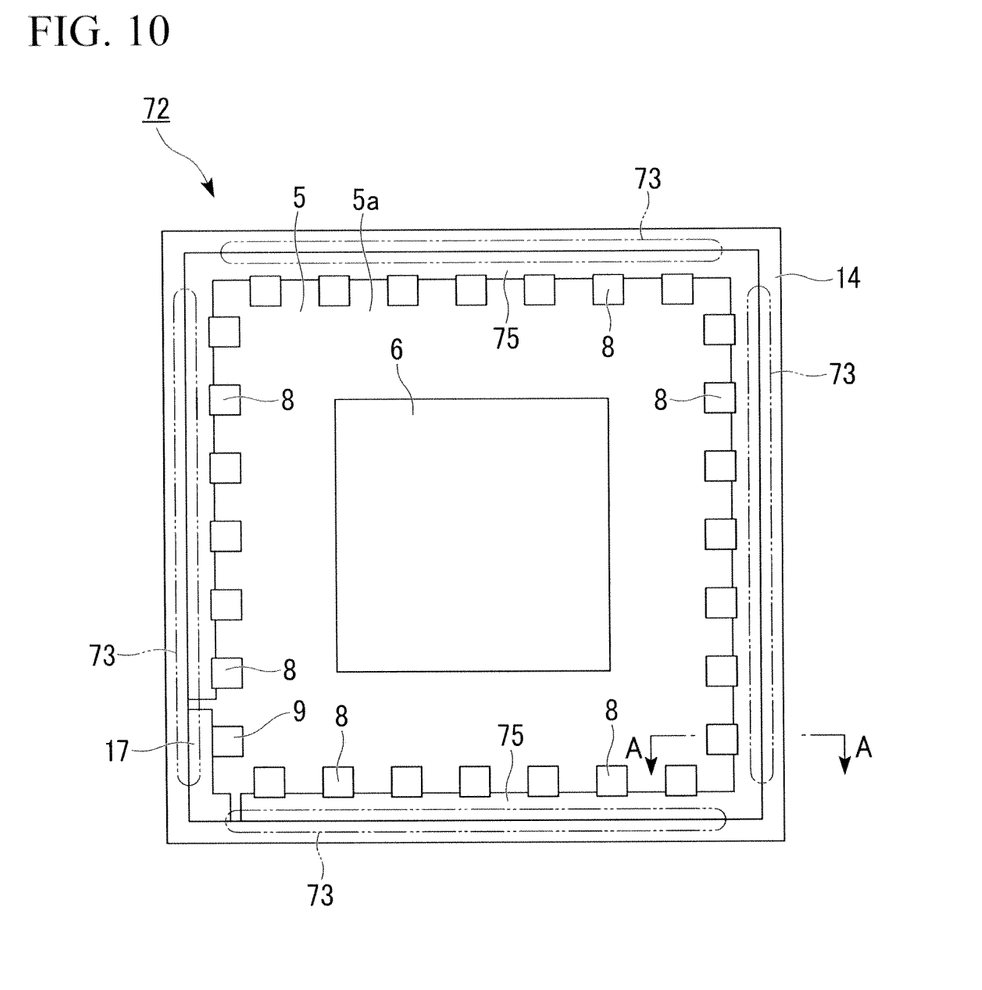
FIG. 10 is a bottom view of a semiconductor chip in a semiconductor device as a fourth embodiment of the present invention.

As shown in FIG. 10, a semiconductor chip 72 of the semiconductor device in the present embodiment has first capacitively coupled parts 73, each being a capacitive element having an MIMC (Metal-Insulator-Metal Capacitor) structure, instead of the first capacitively coupled parts 10 of the semiconductor chip 3 in the semiconductor device 1 of the first embodiment.

Figure 11:
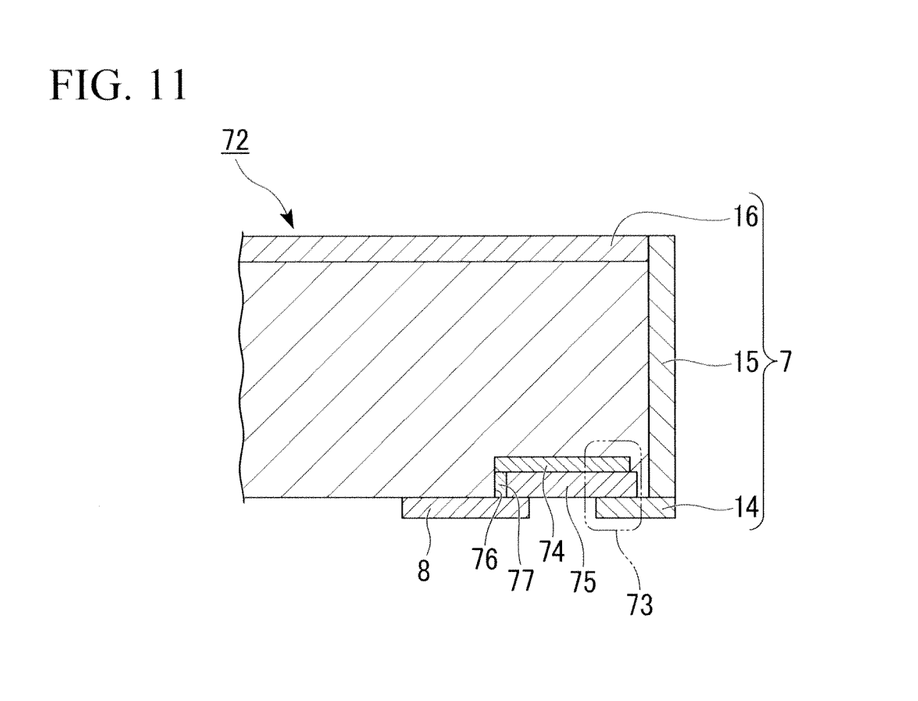
FIG. 11 is a sectional view along cutting line A-A in FIG. 10.

As shown in FIG. 11, each third capacitively coupled part 73 has a lower conductor layer 74 connected to the relevant DC terminals 8, the above-described outer-peripheral ground 14, and a dielectric 75 interposed between the lower conductor layer 74 and the outer-peripheral ground 14.

The DC terminals 8 and the lower conductor layer 74 are electrically connected to each other by a metal member 77 embedded through a through-hole 76. In addition, an interval of a few hundreds nanometers is secured between the outer-peripheral ground 14 and the lower conductor layer 74 in the thickness direction of the semiconductor chip 3, and the dielectric 75 is disposed at the interval, thereby forming a capacitive element having the MIMC structure.

Although it is most preferable to form the lower conductor layer 74 using gold, aluminum, platinum, or the like, another conductive material does not disturb the effects of the present embodiment.

In addition, although it is most preferable to secure an interval of approximately 100 nm between the lower conductor layer 74 and the corresponding DC terminals 8, the interval is not limited to this value. Furthermore, although it is most preferable that the dielectric 75 is made of silicon nitride, the material is not limited thereto.

In accordance with the semiconductor device of the present embodiment, a shielding structure for reliably blocking electromagnetic waves emitted from the electronic circuit 6 can be implemented without providing no additional process.

In addition, it is possible to have improved capacitance of capacitive coupling of the first capacitively coupled parts 73, thereby further reliably blocking electromagnetic waves which pass through the outer-peripheral ground 14 and the DC terminals 8.

Although the first to fourth embodiments of the present invention have been explained in detail with reference to the drawings, specific structures of the present invention are not limited thereto, and structural modifications or the like within the scope of the invention are also possible.

Figure 12:
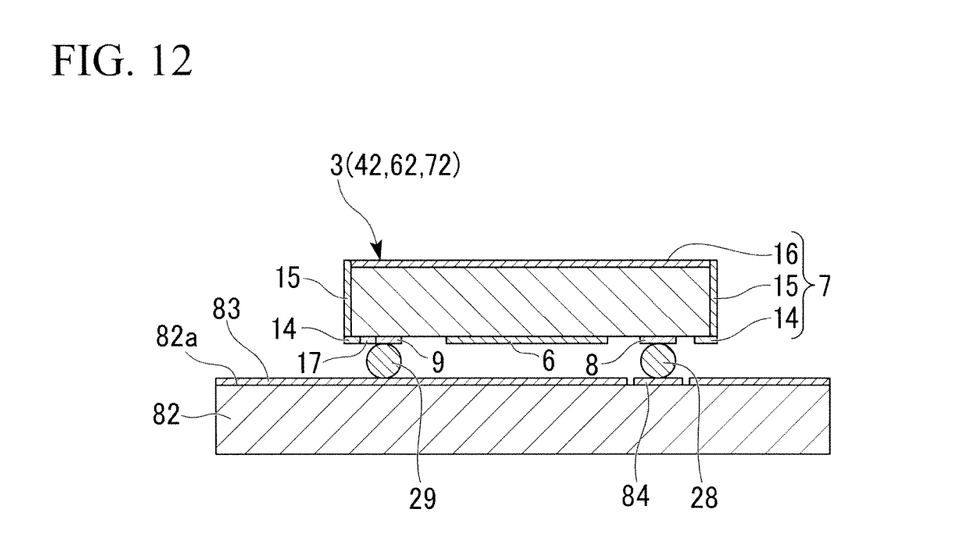
FIG. 12 is a side sectional view of a variation of the embodiments of the present invention.

For example, although the semiconductor chip 3, 42, 62, or 72 (called "semiconductor chip 3 or the like" below) is connected to the multilayer substrate 2 (i.e., wiring board) by means of flip-chip connection in the first to fourth embodiments, the semiconductor chip 3 or the like may be connected to a single-layer substrate 82 (wiring board) by means of flip-chip connection (see FIG. 12).

On a top surface 82a of the single-layer substrate 82, a ground terminal (i e, board-side ground terminal) 83 and DC terminals (i.e., board-side power supply terminals) 84 are provided. The DC terminals 8 are electrically connected to the DC terminals 84 via bumps 28, and the ground terminal 9 is electrically connected to the ground terminal 83 via a bump 29.

Employment of the single-layer substrate 82 can reduce the cost for manufacturing the semiconductor device.

The target to which the semiconductor chip 3 or the like is connected is not limited to the multilayer substrate 2 or the single-layer substrate 82. It is obvious that the effects of the present invention can be obtained by other several embodiments. For example, the semiconductor chip 3 or the like may be connected to another semiconductor chip.

Additionally, in the first to fourth embodiments, the first capacitively coupled part, the second capacitively coupled part, or the third capacitively coupled part may include an appropriate combination of a pair of inter-digital electrodes and a capacitive element having an MIMC structure.

In addition, although the ground terminal 9 and the outer-peripheral ground 14 are directly and electrically connected via the wiring pattern in the first to fourth embodiments, the ground terminal 9 and the outer-peripheral ground 14 may be electrically connected by means of capacitive coupling.

INDUSTRIAL APPLICABILITY

In accordance with the present invention, an shield layer and a chip-side power supply terminal is capacitively coupled while they are separated from each other by a specific distance. Therefore, a substantial short circuit state is implemented, thereby effectively blocking the relevant electromagnetic waves even between the shield layer and the chip-side power supply terminal.

Additionally, in accordance with the structure of the present invention for the flip-chip connection between a wiring board and a semiconductor chip, emitted electromagnetic waves can be reliably blocked without providing an additional process.

REFERENCE SYMBOLS

1 semiconductor device
2 multilayer substrate (wiring board)
3, 42, 62, 72 semiconductor chip
5a bottom surface (opposite surface
6 electronic circuit
7 shield layer
8 DC terminal (chip-side power supply terminal)
9 ground terminal (chip-side ground terminal)
10, 43, 73 first capacitively coupled part 18, 19, 46, 47, 50, 51, 64, 65 inter-digital electrode
22a top surface (first surface)
23, 83 ground terminal (board-side ground terminal)
24, 84 DC terminal (board-side power supply terminal)
44 second capacitively coupled part
63 third capacitively coupled part
75 dielectric
82 single-layer substrate (wiring board)

The invention claimed is:

1. A semiconductor device comprising:
    a wiring board comprising a first surface on which a board-side ground terminal and a board-side power supply terminal are provided;
    a semiconductor chip arranged so as to face the first surface of the wiring board, where the first surface faces an opposite surface of the semiconductor chip;
    a shield layer provided at the semiconductor chip so as to cover an outer surface of the semiconductor chip except for the opposite surface;
    a chip-side power supply terminal which is provided on the opposite surface and is electrically connected to the board-side power supply terminal;
    a chip-side ground terminal which is provided on the opposite surface and is electrically connected to the board-side ground terminal and the shield layer; and
    a first capacitively coupled part by which the shield layer and the chip-side power supply terminal are capacitively coupled with each other, and
    wherein the first capacitively coupled part comprises inter-digital electrodes which are respectively formed at the shield layer and the chip-side power supply terminal, the inter-digital electrodes each having a comb shape, and are separated from and engaged with each other.

2. The semiconductor device in accordance with claim 1, wherein the semiconductor chip is connected to the wiring board by using a flip-chip connection.

3. The semiconductor device in accordance with claim 1, further comprising:
    an electronic circuit provided on the opposite surface,
    wherein a plurality of the chip-side power supply terminals are provided around the electronic circuit.

4. The semiconductor device in accordance with claim 1, further comprising:
    a second capacitively coupled part by which at least one chip-side power supply terminal and the chip-side ground terminal are capacitively coupled with each other.

5. The semiconductor device in accordance with claim 4, wherein the second capacitively coupled part comprises inter-digital electrodes which are respectively formed at the chip-side power supply terminal and the chip-side ground terminal, where the inter-digital electrodes each have a comb shape, and are separated from and engaged with each other.

6. The semiconductor device in accordance with claim 1, further comprising:
    a third capacitively coupled part by which at least one pair of the chip-side power supply terminals adjacent to each other are capacitively coupled with each other.

7. The semiconductor device in accordance with claim 6, wherein the third capacitively coupled part comprises inter-digital electrodes which are respectively formed at the adjacent chip-side power supply terminals, where the inter-digital electrodes each have a comb shape, and are separated from and engaged with each other.

8. The semiconductor device in accordance with claim 1, wherein the first capacitively coupled part is formed by connecting the shield layer and the chip-side power supply terminal via a dielectric, and comprises a capacitive element comprising a Metal-Insulator-Metal Capacitor (MIMC) structure.

9. The semiconductor device in accordance with claim 1, wherein the shield layer and the chip-side ground terminal are directly and electrically connected via a conductor.

* * * * *